(12) United States Patent
Davis

(10) Patent No.: US 6,993,401 B1
(45) Date of Patent: Jan. 31, 2006

(54) METHOD AND APPARATUS FOR SIMPLIFIED DETERMINATION OF A DESIGN SCHEDULE UTILIZING COMPUTER AIDED DESIGN (CAD) MODEL INFORMATION

(75) Inventor: Kenneth L. Davis, San Diego, CA (US)

(73) Assignee: Autodesk, Inc., San Rafael, CA (US)

( * ) Notice: Subject to any disclaimer, the term of this patent is extended or adjusted under 35 U.S.C. 154(b) by 592 days.

(21) Appl. No.: 10/005,482

(22) Filed: Nov. 7, 2001

(51) Int. Cl.
*G06F 19/00* (2006.01)

(52) U.S. Cl. .......................... 700/100; 700/95; 700/97; 700/98; 700/182; 703/1

(58) Field of Classification Search .............. 700/182, 700/95, 97–98, 100, 1; 703/1
See application file for complete search history.

(56) References Cited

U.S. PATENT DOCUMENTS

| | | | | |
|---|---|---|---|---|
| 5,357,439 A | * | 10/1994 | Matsuzaki et al. | 700/96 |
| 5,402,349 A | * | 3/1995 | Fujita et al. | 700/97 |
| 5,495,430 A | * | 2/1996 | Matsunari et al. | 703/6 |
| 5,767,848 A | * | 6/1998 | Matsuzaki et al. | 715/751 |
| 6,021,358 A | * | 2/2000 | Sachs | 700/98 |
| 6,223,092 B1 | * | 4/2001 | Miyakawa et al. | 700/103 |
| 6,230,066 B1 | * | 5/2001 | Sferro et al. | 700/104 |
| 6,343,285 B1 | * | 1/2002 | Tanaka et al. | 705/400 |
| 6,614,430 B1 | * | 9/2003 | Rappoport | 345/420 |
| 6,859,768 B1 | * | 2/2005 | Wakelam et al. | 703/1 |
| 2001/0047251 A1 | * | 11/2001 | Kemp | 703/1 |
| 2002/0042696 A1 | * | 4/2002 | Garcia et al. | 703/1 |

* cited by examiner

*Primary Examiner*—Anthony Knight
*Assistant Examiner*—Ronald D Hartman, Jr.
(74) *Attorney, Agent, or Firm*—Fish & Richardson P.C.

(57) ABSTRACT

The invention includes computer instructions that access a computer aided design (CAD) model information corresponding to a CAD model. Once the CAD model information is accessed, the computer instructions operate to determine a time value corresponding to the CAD model information based at least upon a complexity value associated with the CAD model. The determined time value facilitates scheduling for completion of the CAD model. As a result, a design schedule utilizing solid model information is determined. In one embodiment, the computer instructions are part of a mechanical design software application. In one embodiment, the mechanical software application, including the computer instructions, is embodied in a distribution storage medium.

42 Claims, 8 Drawing Sheets

FIG. 5

| Axel Assembly | | | | |
|---|---|---|---|---|
| Part Types (w/in part family) | Complexity (1-10) | User Level (1-5) | Est. Time (Days) | Actual Time (Days) |
| Hub | 5 | 5 | 15 | 10 |
| Bearings | 5 | 3 | 20 | 17 |
| Axel | 7 | 1 | 10 | 12 |
| Wheel | 3 | 1 | 4 | 4 |

METHOD AND APPARATUS FOR SIMPLIFIED DETERMINATION OF A DESIGN SCHEDULE UTILIZING COMPUTER AIDED DESIGN (CAD) MODEL INFORMATION

FIELD OF INVENTION

The invention relates to the field of computer aided design (CAD). More specifically, the invention relates to simplified determination of manufacturing project schedules utilizing CAD model information.

BACKGROUND OF THE INVENTION

Manufacturing a part may involve a number of various stages. Each stage may involve certain aspects of manufacturing. For example, in the case of manufacturing a part, such as a steel wheel for an automobile, a first stage may involve an engineer designing a wheel to meet a customer's needs. Once designed by the engineer, the design of the wheel is utilized to make a pattern to form a mold of the wheel. Subsequently, steel is poured into the mold to cast the wheel, and the wheel casting is cleaned and inspected for quality. In order to complete the wheel for delivery to the customer, features, such as lugholes, decorative patterns, polishing, and the like, may be machined into the wheel.

Additionally, below each stage described above various additional stages may also be present. For example, in designing the wheel, the engineer may design a hub, spokes, and so forth of for the wheel. Making the pattern may involve various aspects, such as making a core box for particular features in the casting, checking the availability of materials, and selecting a particular vendor. For more complex parts, such as entire automobiles, the stages become more complex and numerous.

An important aspect of manufacturing is coordinating and scheduling (i.e., project scheduling) all of the various stages. Project scheduling the various stages provides proper completion of the various stages at prescribed times and ensures that the part is manufactured in a timely manner to the satisfaction of the customer. However, the project scheduling of all of the various stages may increase in complexity and difficulty based at least upon the complexity of the design because a highly complex design may require numerous and complicated stages to manufacture.

Accordingly, often times, an initial variable considered in determining a project schedule for manufacturing a particular part involves an engineer determining a time required to completely design the particular part with its predetermined complexity and specifications. Determining this initial variable, often times, involves gathering a project team, including the engineer(s) responsible for designing the part, and the engineer(s) providing the required time based at least upon their experience.

The time based at least upon experience of the engineers may only be an estimate because as the part is designed, the engineer may make numerous modifications, and the methodology of the design may be modified (i.e., instead of a flat surface, a curved surface and so forth). Furthermore, the engineer may design complex parts utilizing computer aided design (CAD) programs because CAD programs allow a user to design various parts in "virtual" space before the parts ever reach a manufacturing stage. As CAD programs have become more powerful, parts modeled in "virtual" space (i.e., CAD models) have become more true to life. In the example of the wheel, the engineer may design each component of the wheel (i.e., the hub, spokes, and so forth of for the wheel) as separate CAD models and assemble the CAD models for the completed wheel. Utilizing CAD programs allows the engineer to easily make various modifications during the design process.

Because the project scheduling is based at least upon the complexity of the part thereby affecting the time required to design the part, modifications in the estimated time may detrimentally affect the subsequent stages of the manufacturing process. However, the estimated time for the design is commonly used to initiate the project scheduling. The project scheduling may then be incorporated into any project scheduling software, such as, Microsoft® Project, by Microsoft Corporation of Redmond, Wash.

BRIEF DESCRIPTION OF DRAWINGS

The invention is illustrated by way of example and not by way of limitation in the figures of the accompanying drawings, in which the like references indicate similar elements and in which:

FIG. 5 illustrates determining a design schedule for a solid model utilizing solid model information, in accordance with an alternate embodiment of the invention;

DETAILED DESCRIPTION OF THE INVENTION

Figure 1:
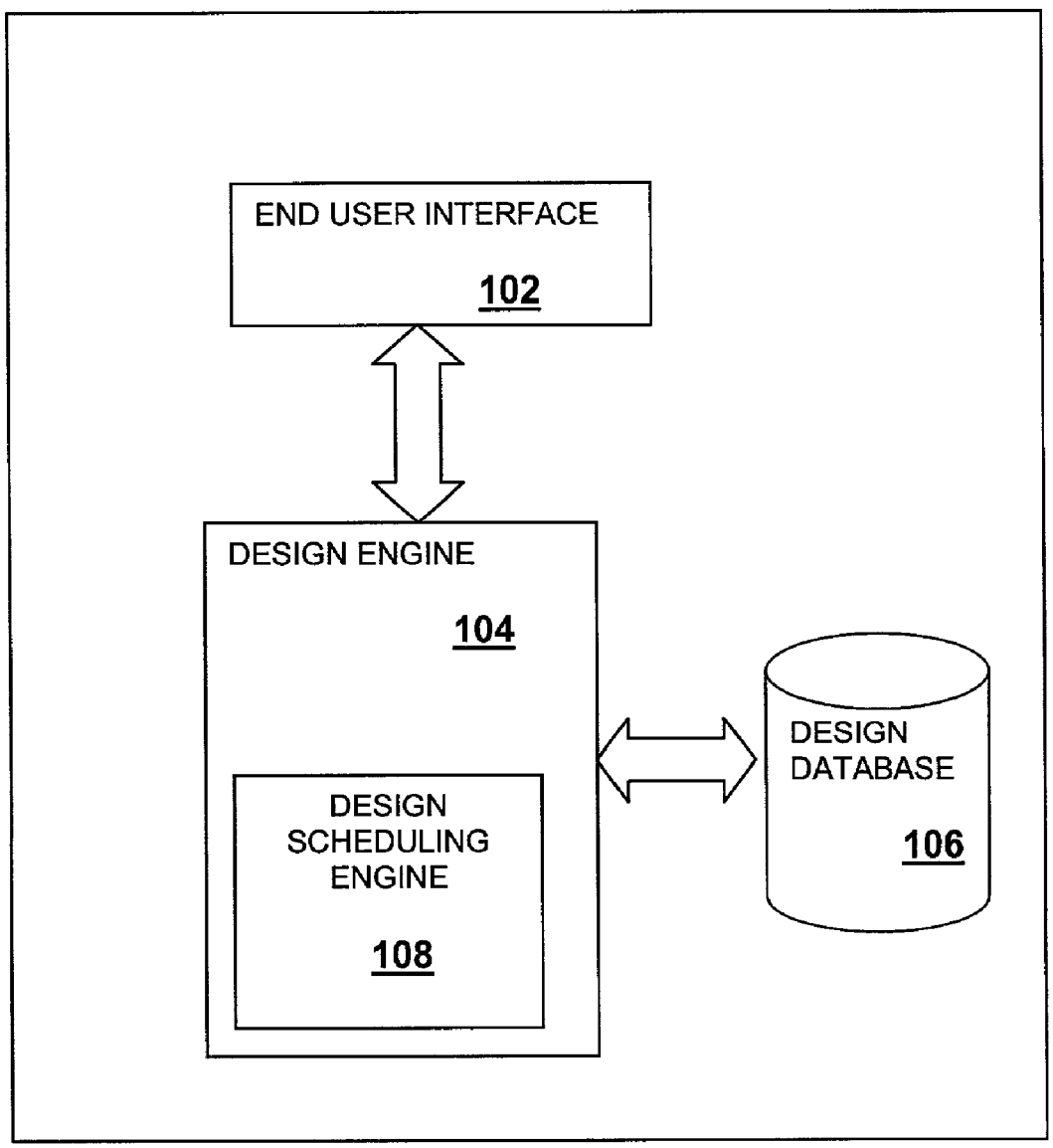
FIG. 1 illustrates a block diagram of one embodiment of a mechanical design application for determining a design schedule utilizing solid model information, in accordance with one embodiment of the invention.

In the following description, various aspects of the invention will be described. However, it will be apparent to those skilled in the art that the invention may be practiced with only some or all described aspects. For purposes of explanation, specific numbers, materials and configurations are set forth in order to provide a thorough understanding of the invention. However, it will also be apparent to one skilled in the art that the invention may be practiced without the specific details. In other instances, well-known features are omitted or simplified in order not to obscure the invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As well understood by those skilled in the art, these quantities take the form of electrical, magnetic, or optical signals capable of being stored, transferred, combined, and otherwise manipulated through mechanical and electrical components of the computer system, and the term computer system includes general purpose as well as special purpose data processing machines, systems, and the like, that are standalone, adjunct or embedded.

Various operations will be described as multiple discrete steps in turn, in a manner that is most helpful in understanding the invention. However, the order of description should not be construed as to imply that these operations are necessarily order dependent. In particular, these operations need not be performed in the order of presentation.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment or invention. Furthermore, the particular features, structures, or characteristics may be combined in any suitable manner in one or more embodiments.

For the purposes of describing the invention, 3-D computer aided design (CAD) models will be referred to as solid models. That is, the 3-D CAD models may have solid properties, such as, but not limited to, volume, weight, and density. Additionally, solid operations, such as subtract, unite, and the like, may be performed utilizing the 3-D CAD models. Furthermore, it should be appreciated that the 3-D CAD models may be of the parametric type, where various aspects of the 3-D CAD models may be updated utilizing underlying sketches, and so forth. Accordingly, in the CAD environment, the 3-D CAD models may be referred to as solid models.

In various embodiments of the invention, an improved way of determining a design schedule utilizing solid model information is disclosed. This and other advantages will be evident from the disclosure.

FIG. 1 illustrates a block diagram of one embodiment of a mechanical design application for determining a design schedule utilizing solid model information, in accordance with one embodiment of the invention. In FIG. 1, mechanical design application 100 includes an end user interface 102, a design engine 104, and a design database 106. The design engine 104 includes, in particular, a design scheduling engine 108, in accordance with the invention. Together, the elements cooperate to determine a design schedule utilizing solid model information, in accordance with the invention.

In FIG. 1, the end user interface 102 operates to graphically display and receive input, from a user, of a solid model under the control of the design engine 104. Under the control of the design engine 104, the design database 106 operates to store solid model information to be accessed for determining a design schedule utilizing solid model information. In particular, the design scheduling engine 108 utilizes various solid model information to determine a design schedule for designing the solid model. Except for the teachings of the present invention incorporated in the design scheduling engine 108, the mechanical design application 100 is intended to represent a broad range of CAD software known in the art, including but not limited to Autodesk Inventor™, available from Autodesk, Inc. of San Rafael, Calif.

Figure 2:
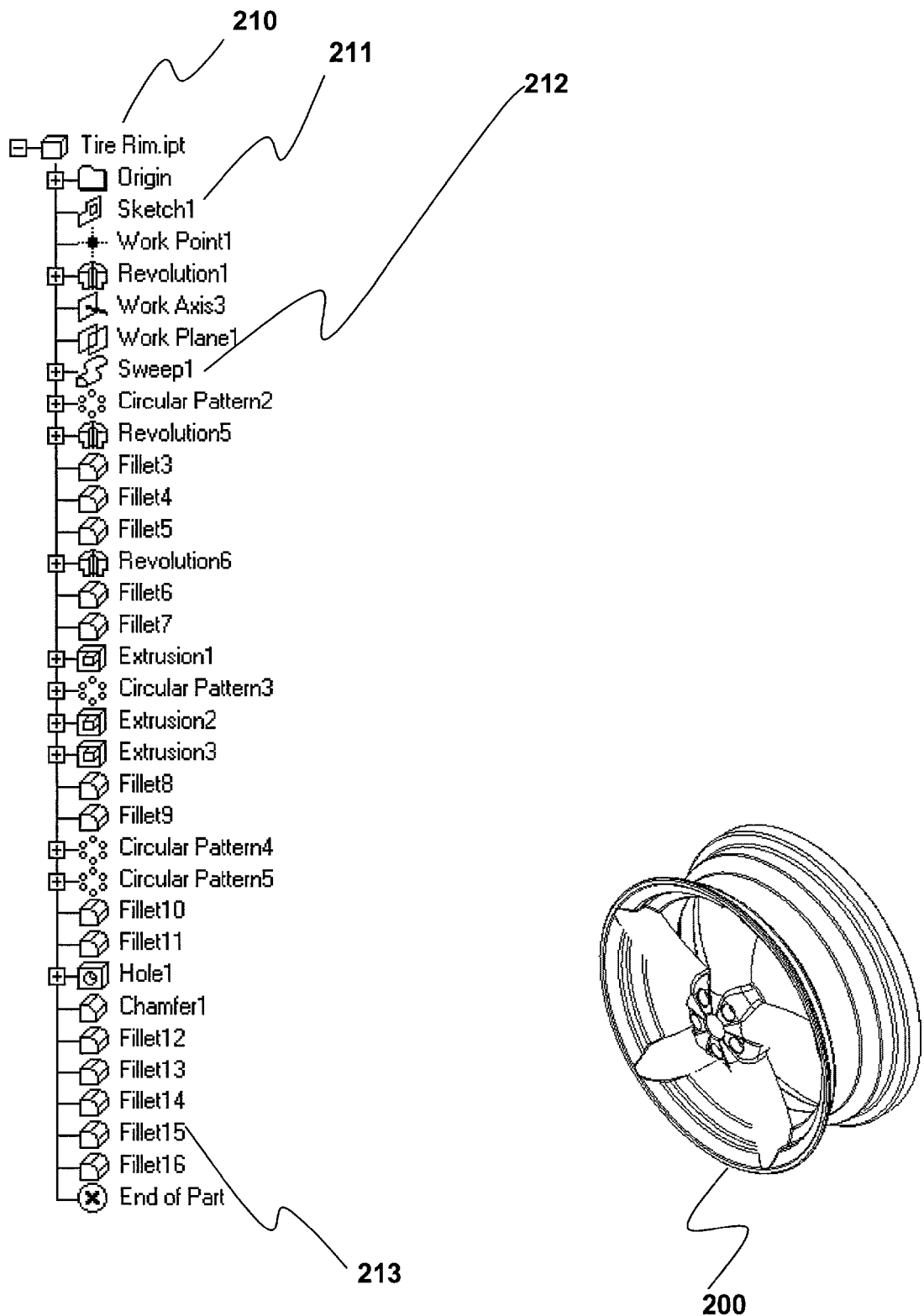
FIG. 2 illustrates an exemplary solid model, for which, a design schedule may be determined utilizing solid model information, in accordance with one embodiment of the invention.

FIG. 2 illustrates an exemplary solid model, for which, a design schedule may be determined utilizing solid model information, in accordance with one embodiment of the invention. Shown in FIG. 2 is a solid model, a wheel 200. Also shown in FIG. 2, is a design list of the wheel 200, wheel design list 210. As will be described in further detail below, wheel design list 210 corresponds to the operations associated with the solid model, the wheel 200, employed by a user (not shown), associated with the design.

As shown in FIG. 2, the wheel design list 210 lists in browser form the operations associated with the wheel 200, such as, a sketch 211, a sweep 212, a fillet 213, to name but a few, thereby providing solid model information corresponding to the solid model, the wheel 200. Each of the operations 211–213 may include further details regarding particular input parameters entered by the user to facilitate the operations 211–213. Each of the operations shown in the wheel design list 210 requires the user spending time to input the various parameters to facilitate the operations 211–213 based at least upon the complexity of the operation. As shown in the wheel design list 210, numerous operations 211–213 may be required to design a single solid model, the wheel 200, thereby increasing the time required to design the wheel 200.

Figure 3:
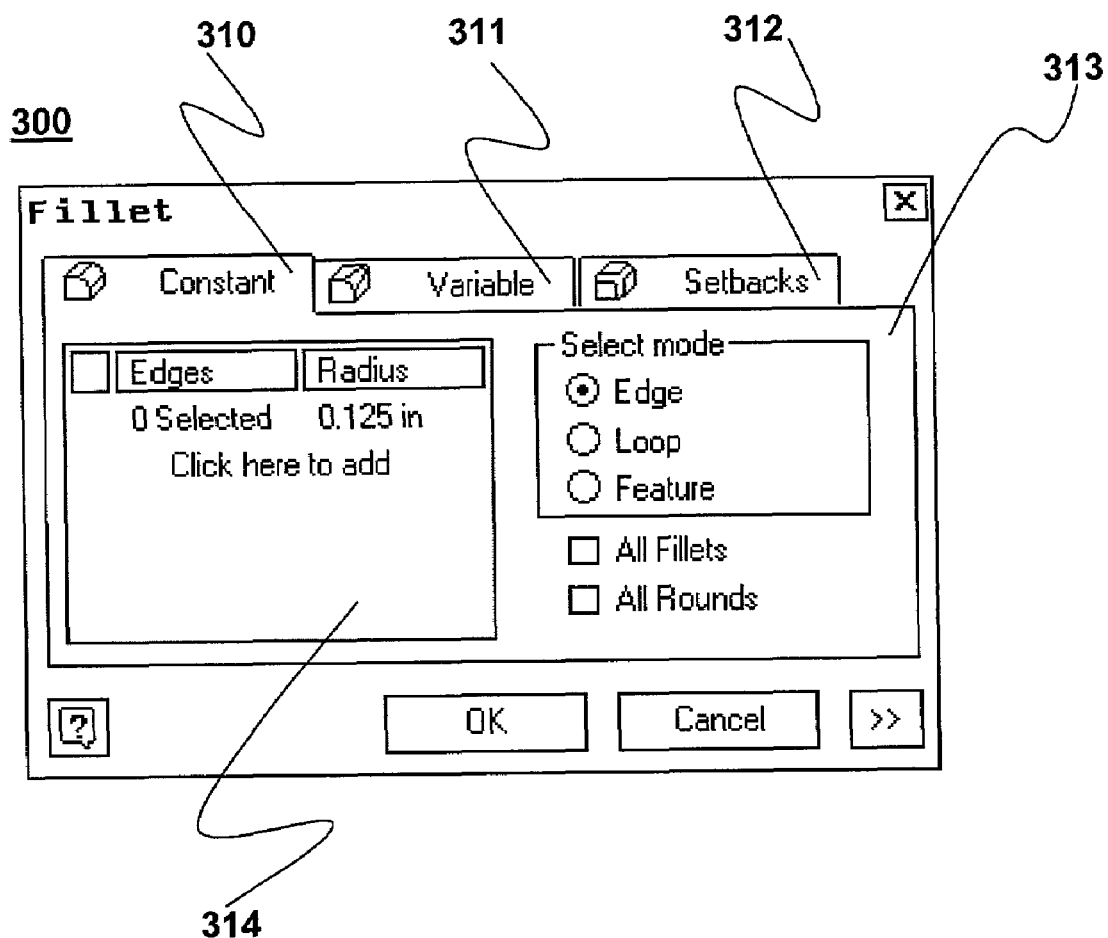
FIG. 3 illustrates an exemplary user interface for inputting of parameters for operations, thereby facilitating determination of a design schedule, in accordance with one embodiment of the invention.

FIG. 3 illustrates an exemplary user interface for inputting of parameters for operations, thereby facilitating determination of a design schedule, in accordance with one embodiment of the invention. Even though the number of operations may be numerous for a single solid model, for the purposes of fully describing the invention, a single exemplary operation is described in detail. However, it should be appreciated by those skilled in the relevant art that the description of the single exemplary operation may be applicable to any type of operation. Accordingly, shown in FIG. 3, is a user interface of an operation associated with a solid model, in particular the fillet operation 213 (shown in FIG. 2) facilitated through user interface as a fillet menu 300. Shown in FIG. 3, the fillet menu 300 includes various fields/icons 310–314 through which inputs may be entered by the user for the fillet operation 213.

As illustrated in FIG. 3, each of various fields/icons 310–314 may also include various fields/icons to further detail the fillet operation 213. Accordingly based at least upon the complexity of the operation, the user may be required to spend an increased amount of time to input the desired inputs via the various fields/icons 310–314. As will be described in further detail below, data corresponding to a quantifiable time for various operations, based at least upon the complexity and the number of operations, may be determined, in accordance with an embodiment of the invention.

Figure 4:
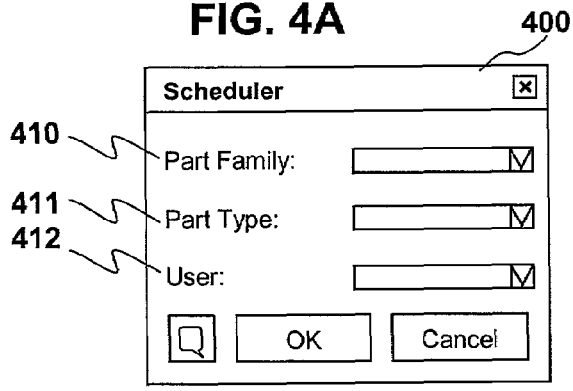
FIGS. 4A–4C illustrate an exemplary user interface and solid model information that may be organized as tables for determining a design schedule for designing a part utilizing the solid model information, in accordance with one embodiment of the invention.

FIGS. 4A–4C illustrate an exemplary user interface and solid model information that may be organized as tables for determining a design schedule for designing a part utilizing the solid model information, in accordance with one embodiment of the invention. For the purposes of describing the invention, it will be assumed that a design schedule for a solid model, such as, but not limited to, the wheel 200 (shown in FIG. 2) will be determined. Furthermore, the design schedule will be for a new design of the wheel 200.

Shown FIG. 4A, an exemplary user interface, scheduler menu 400, includes various fields for the user to enter various inputs, whereby the design engine 102 receives solid model information to be stored in the design database 106

(both shown in FIG. 1) to be accessed by design scheduling engine 108. For example, the scheduler menu 400 includes input fields such as, but not limited to, a part family field 410, a part type field 411, and a user identifier field 412. In the exemplary scheduler menu 400, the part family field 410 may be the field for receiving a particular part family of the wheel 200 such as, but not limited to, "axel assembly". The part type field 411 may receive an input of "wheel", and the designer identifier field 412 may receive a user identifier, such as, but not limited to, user initials "wkb".

Additionally, as shown in FIG. 4A, each of the input fields 410–412 has a drop-down arrow to aid the user in entering the appropriate information. For example, the part family field 410 may include part families that correspond to a particular company (i.e., automotive axel manufacturing company). The part type field 411 may include part types that each of the part families have associated with it, such as, for example, if the part family is axel assembly, the part types that the particular company have associated with the part family may be parts that make up the axel assembly. The user identifier field 412 may have the user identifiers of individual designers that work for the company. Once the information from the above fields is entered and received 410–412, the information may be stored in the design database 106 as solid model information along with the other solid information such as wheel design list 210 (shown in FIG. 2) to be accessed.

Referring now to FIG. 4B, the solid model information received from the scheduler menu 400 is accessed and utilized to determine a design schedule for designing the solid model, the wheel 200, in accordance with one embodiment of the invention. In order to describe the invention, in FIG. 4B, the solid model information is shown organized as an assembly table 420. However, it should be appreciated by those skilled in the relevant art that the solid model information may be organized in any type of structure within the intent and scope of the invention.

As shown in FIG. 4B, the part family, the axel assembly, has four part types that are within the part family 421, a hub 422, bearings 423, an axel 424, and a wheel 425. The four part types 422–425 may represent previously designed part types for the particular part family. Even though, the example part for describing the invention is the wheel 200, the other part types 422–424 are shown in FIG. 4B to illustrate some of the solid model information relationships utilized to determine a design schedule by the design scheduling engine 108.

Continuing to refer to FIG. 4B, associated with each part type 422–425 is a complexity value 431. The complexity value 431 may be determined from solid model information, such as, but not limited to, operations employed by the user to design each part type 422–425 as described above with respect to the wheel 200 and its corresponding wheel design list 210 (both shown in FIG. 2). For example, complexity value 431 may be based at least upon the type of operations and the number of operations, such as the operations described above. In one embodiment, once the design of a part is complete, the design scheduling engine 108 causes other functional blocks (not shown) to access the operation list, such as the wheel design list 210 (shown in FIG. 2), and determines a complexity value for the particular part. As shown in FIG. 4B, the hub part type 422 has a complexity value of 5, the bearings part type 423 have a complexity value of 5, the axel part type 424 has a complexity value of 7, and the wheel part type 425 has a complexity value of 3. Since the complexity value 431 has a range of 1–10, the hub part type 422 and bearings part type 423 may be considered to be of medium complexity, the axel part type 424 of higher complexity, and the wheel part type 425 of relatively low complexity. Continuing with the example of determining a design schedule for the wheel 200, as shown in FIG. 4B, the wheel part type 425 is determined by the design scheduling engine 108 to be of a low complexity based at least upon the number and types of operations associated with a previously designed wheel. Even though the complexity value has a range of 1–10, it should be appreciated by those skilled in the relevant art that the value may be of any range (i.e., any scale).

In FIG. 4B, in addition to the complexity value 431, the assembly table 420 also includes a user level value 432. The user level value 432 may be based at least upon the time a particular user has spent using the mechanical design application 100 (shown in FIG. 1), thereby providing an indication of a user skill level. That is, as the user spends more time using the mechanical design application 100, the more skilled the user becomes with the mechanical design application 100, thereby decreasing the time required to design particular parts using the particular mechanical design application 100. In one embodiment, accordingly, when a user identifier, such as, but not limited to, user initials, is received, via the user identifier field 412 (shown in FIG. 4B), the design scheduling engine 108 causes other functional blocks (not shown) to retrieve a user log associated with the user identifier. Using the retrieved usage log associated with the user identifier, for example the user initials, the design scheduling engine 108 determines the user level value 432. For the example of the wheel 200, the user initials received may be wkb, and the corresponding usage log may be long, such as, time equivalent to 5 years of usage, thereby the design scheduling engine 108 determines the user level value to be 5 (i.e., very experienced with particular mechanical design application 100). Again, in FIG. 4B, the user level value 432 has a range of 1–5, but it should be appreciated by those skilled in the relevant art that the value may be of any range (i.e., any scale).

Referring to an estimated time column 433, in FIG. 4B, the design scheduling engine 108 accesses the solid model information 431 & 432 for the various part types 422–425 and utilizes this information to determine a design schedule for each of the various part types 422–425, in accordance with one embodiment of the invention. As shown in FIG. 4B, utilizing the solid information for the hub 422, which includes a complexity value 431 of 5 and a user identifier with a user level value 432 of 5, the design scheduling engine 108 has determined that the estimated time should be 15 days 433 to design the part. Utilizing the solid model information for the bearings 423, in FIG. 4B, the design scheduling engine 108 has determined a design schedule of 20 days 433 because even though the complexity value 431 of the bearings 423 is similar to the hub 422, the solid model information for the bearings include a user identifier with a user level value 432 of 3. Shown in FIG. 4B, two designers having the same designer level value 432 of 1 will have different design schedules 433 for part types having different complexity values 431 as shown for the axel 424 and the wheel 425.

Finally, referring to FIG. 4C, utilizing the solid model information, as described above with respect to FIGS. 4A & 4B, in one embodiment, the design scheduling engine 108 has determined a design schedule for the wheel 200 and is illustrated as a wheel table 44. Shown in FIG. 4C, the wheel table 440 includes the part types within the part family column 421 under which the wheel 200 is listed. The complexity value 431 for the wheel 200 is determined by the design scheduling engine 108 to be 3, and the user level value 432 for the user identifier of wkb is determined by the design scheduling engine 108 to be 5. Thus, the design schedule for the wheel 200 designed by the user wkb is determined by the design scheduling engine 108 to be 2 days.

As a result, a design schedule is determined for a solid model utilizing solid model information.

FIG. 5 illustrates determining a design schedule for a solid model utilizing solid model information, in accordance with an alternate embodiment of the invention. Shown in FIG. 5 is an assembly table 500 that is similar to the assembly table 420 (shown in FIG. 4B). However, in FIG. 5, the assembly table 500 includes additional solid information as actual time 510. As described above with respect to FIGS. 4B & 4C, the design scheduling engine 108 may determine the estimated time 433 from the solid model information of complexity value 431 and user level value 432. In addition, in the embodiment shown in FIG. 5, the actual time 510 required to design the part types may also be utilized (i.e., the times recorded).

When the design scheduling engine 108 determines design schedule for a new part, the design scheduling engine 108 may take into account discrepancies between the estimated time 433 and the actual time 510. For example, in the case of the hub part type 422, the estimated time 433 is 15 days, but the actual time 510 is 10 days. The design scheduling engine 108 may determine the design schedule for the new part based at least upon the actual time 510 if a predetermined threshold is reached, such as, but not limited to, 20% discrepancy between the estimated time 433 and the actual time 510. That is, if the actual time 510 is 20% less than the estimated time 433, the design scheduling engine 108 may determine the design schedule for the new part will be based at least upon the actual time 510. Accordingly, if the actual time is 20% more than the estimated time 433, the design scheduling engine 108 may determine the design schedule for the new part based at least upon the actual time 510. However, if the actual time 510 does not vary from the estimated time 433 by more than 20%, the design scheduling engine 108 may determine the design schedule for the new part based at least upon the estimated time 433. Furthermore, utilizing the actual time 510 by the design scheduling engine 108 to determine the design schedule may involve the user level value 432 (i.e., the actual time may be adjusted for the user level value 432).

As a result, a design schedule is determined for a solid model utilizing solid model information taking into account for actual design times.

Figure 6:
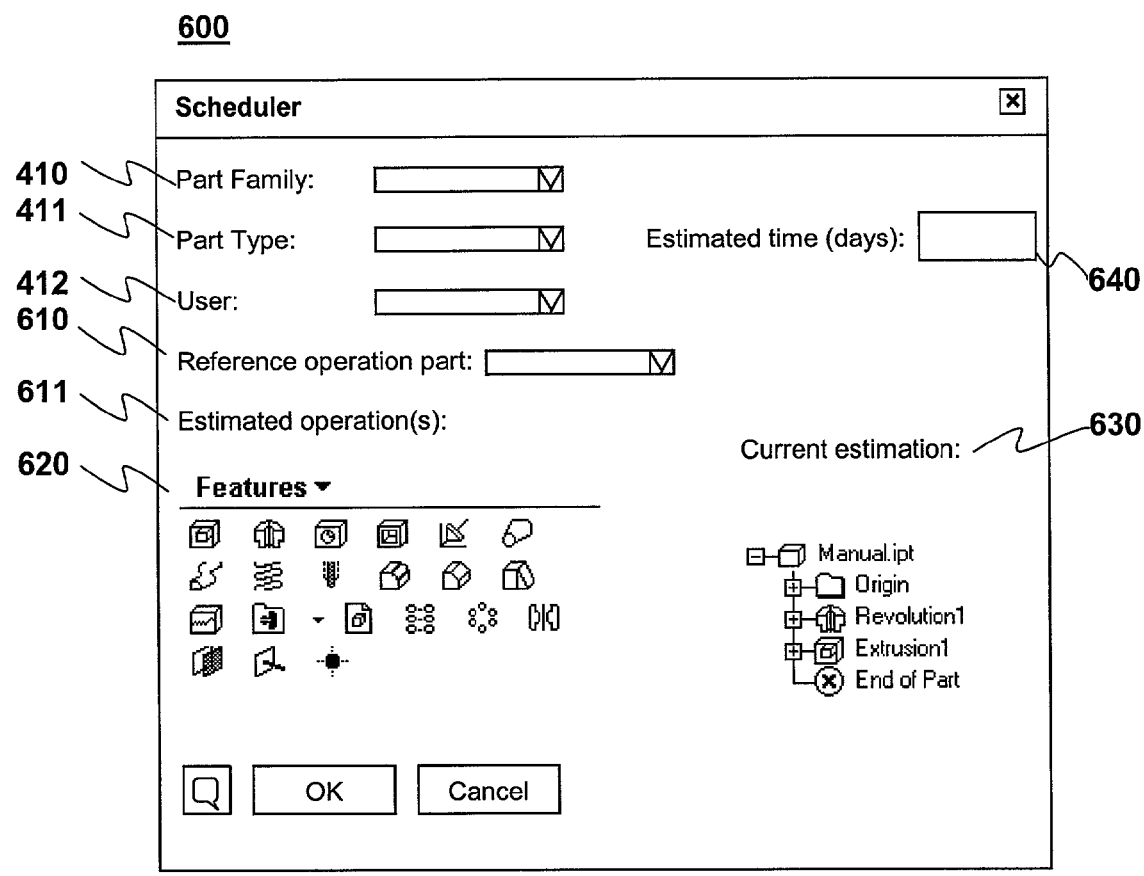
FIG. 6 illustrates an exemplary user interface for determining a design schedule for designing a part utilizing the solid model information, in accordance with another embodiment of the invention.

FIG. 6 illustrates an exemplary user interface for determining a design schedule for designing a part utilizing the solid model information, in accordance with another embodiment of the invention. Shown in FIG. 6, a scheduler menu 600 includes various fields 410–412, 610, 611, and 620 to be entered by the user. Similar to the fields described above, the scheduler menu 600 includes the part family field 410, the part type field 411, and the user identifier field 412. However, when determining a design schedule for a new part, the user may start from a reference operation part (i.e., a solid model that may be similar to the new part, in particular, similar operations). This is facilitated by a reference operation part field 610, where a part type may be selected from a list of similar solid models. If selection of a reference operation part is received, the design scheduling engine 108 utilizes the solid model information of the selected reference operation part and determines an estimated time, as previously described, and displays the time in a estimated time field 640 included in the scheduler menu 600. Furthermore, as shown in FIG. 6, a design list, such as the wheel design list 210 (shown in FIG. 2), is generated and displayed in a current estimation field 630 within the scheduler menu 600. The current estimation field facilitates a visual representation of the operations involved with the new design.

Shown in FIG. 6, the scheduler menu 600 includes an estimated operation(s) field 611. The estimated operation(s) field 611 includes various operations 620, where the various operations 620 are generated and displayed similar to the manner in which the various operation 620 are generated and displayed during the execution of the mechanical design application 100. Even if a reference operation part is selected, the user has the option of selecting additional operations 620 from the estimated operation(s) field 611. If selection of the additional operations is received, the design scheduling engine 108 determines a new design schedule taking into account the received additional operation. Furthermore, the new design schedule is generated and displayed in the estimated time field 640, thereby facilitating dynamic updates to the design schedule for the new part as solid information varies.

Alternatively, the user may not start with a reference operation part, but instead design a part from the varying operations that may be associated with a particular new part (i.e., relying on experience to determine the types of solid information that may be required for the new part). The scheduler menu 600 shown in FIG. 6 facilitates receiving user selected solid information.

As a result, a design schedule is dynamically determined and updated for a solid model utilizing user entered solid model information.

Figure 7:
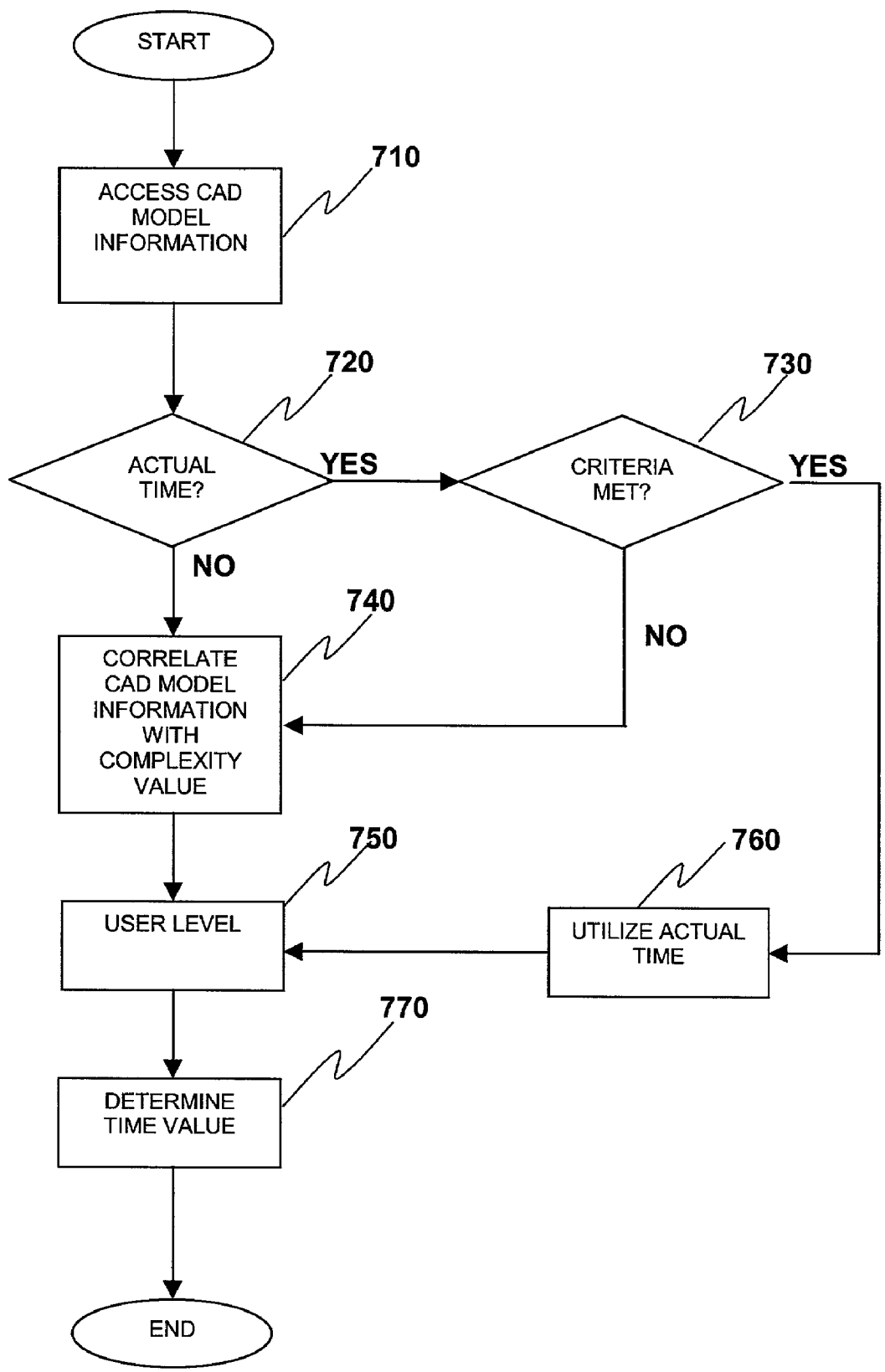
FIG. 7 illustrates relevant operational flows of one embodiment of the design scheduling engine.

FIG. 7 illustrates relevant operational flows of one embodiment of the design scheduling engine 108 of FIG. 1. For the illustrated embodiment, the design scheduling engine 108 is programmed in an event driven model (i.e., the design scheduling engine 108 is to execute in a system environment where various event notification services are available from an operation system). One example of such an operation system suitable for practicing the invention is the Windows® operating system, available from Microsoft Corporation of Redmond, Wash. In alternate embodiments, the design scheduling engine 108 may be implemented in other programming approaches.

As shown in FIG. 7, the design scheduling engine 108 accesses CAD model information corresponding to a CAD model 710. As previously described, the CAD model information may include one or more of part family 410, part type 411, user identifier 412, reference operation part 610, estimated operation(s) 611, and so forth that may be received through the above exemplary user interfaces. As previously described, utilizing the CAD model information, an estimated time may be determined.

In an embodiment, in response to accessing the CAD model information, the design scheduling engine 108 determines if actual time is included in the accessed CAD model information 720. If it is determined that actual time is included in the CAD model information, the design scheduling engine 108 determines if a threshold is met for utilizing the actual time 730. As previously described, the threshold for utilizing the actual time may be based at least upon a 20% discrepancy. Shown in FIG. 7, if the threshold is met by the actual time, the actual time is utilized 760 by the design scheduling engine 108, and a user level value is taken into account 750 to determine a time value for scheduling of the design of the solid model 770.

However, if it is determined that the actual time is not included in the accessed CAD model information and/or the threshold is not met 720 & 730, the design scheduling engine 108 correlates the received CAD model information with a complexity value 740, as described above. Once the complexity value is determined, the design scheduling engine 108 takes into account the user level value 750, which can be determined by retrieving user information, and determines a time value for scheduling of the design of the solid model 770.

As a result, a design schedule utilizing solid model information is determined.

Figure 8:
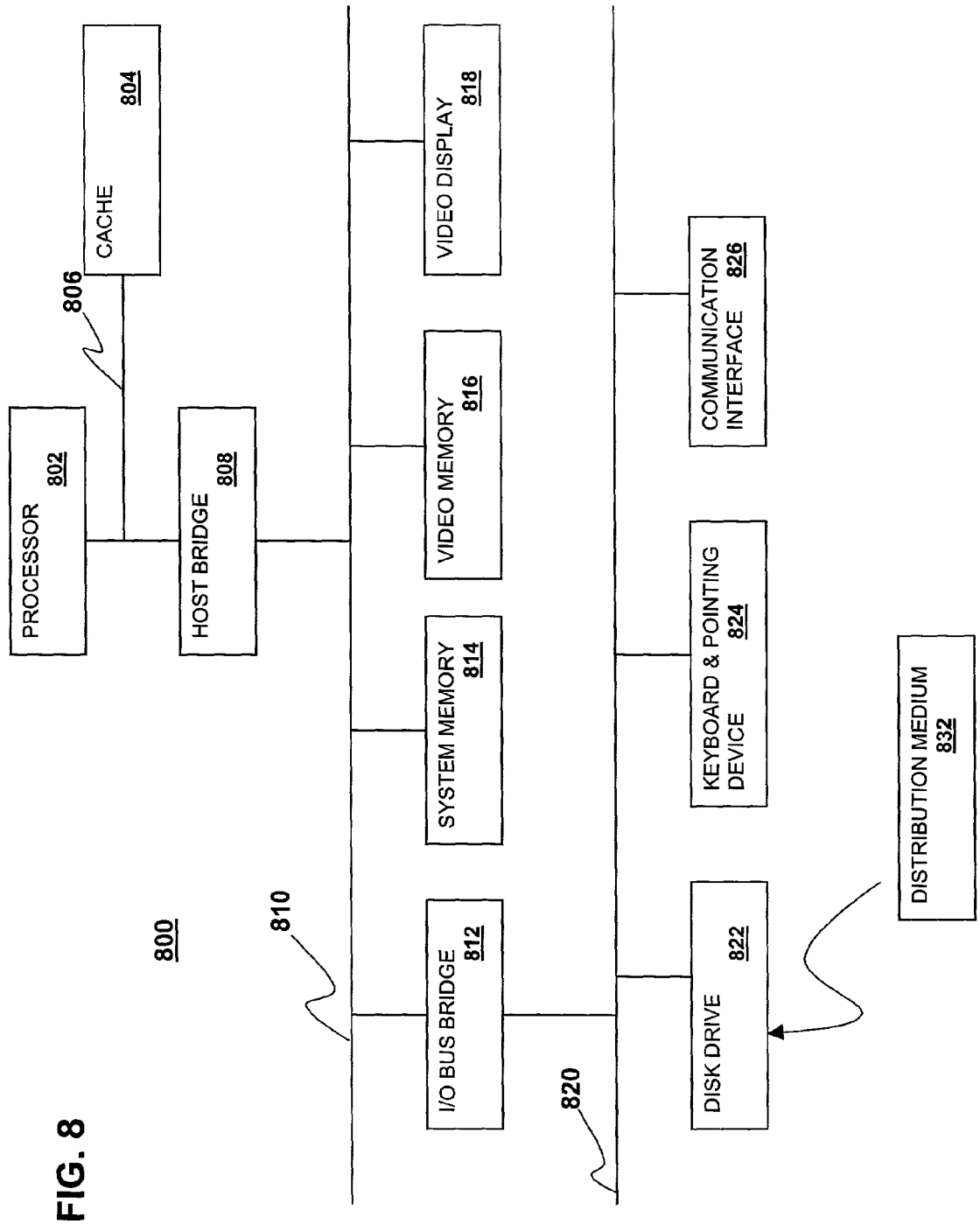
FIG. 8 illustrates one embodiment of a computer system suitable to be programmed with the mechanical design application of the invention.

FIG. 8 illustrates one embodiment of a computer system suitable to be programmed with the mechanical design application of the invention. As shown, for the illustrated embodiment, computer 800 includes processor 802, processor bus 806, high performance I/O bus 810 and standard I/O bus 820. Processor bus 806, and high performance I/O bus 810 are bridged by host bridge 808, whereas I/O buses 810 and 820 are bridged by I/O bus bridge 812. Coupled to processor bus 806 is cache 804. Coupled to high performance I/O bus 810 are system memory 814 and video memory 816, against which video display 818 is coupled. Coupled to standard I/O bus 820 are disk drive 822, keyboard and pointing device 824, and communication interface 826.

These elements perform their conventional functions known in the art. In particular, disk drive 822 and system memory 814 are used to store permanent and working copies of the mechanical design system incorporated with the teachings of the invention. The permanent copy may be pre-loaded into disk drive 822 in factory, loaded from distribution medium 832, or down loaded from a remote distribution source (not shown). Distribution medium 832 may be a tape, a CD, and DVD or other storage medium of the like. The constitutions of these elements are known. Any one of number implementations of these elements known in the art may be used to form computer system 800.

In general, those skilled in the art will recognize that the invention is not limited by the details described, instead, the invention can be practiced with modifications and alterations within the spirit and scope of the appended claims. The description is thus to be regarded as illustrative instead of restrictive on the invention.

Thus, an improved way of determining a design schedule utilizing solid model information is disclosed.

What is claimed is:

1. A computer-implemented method comprising:
   accessing a computer aided design (CAD) model information;
   determining a complexity value for a CAD model from the CAD model information;
   determining a design schedule for designing the CAD model on a computer based at least in part on the complexity value;
   receiving an indication of a user identifier;
   retrieving a user log associated with the user identifier; and
   determining a user level value based on the user log;
   where determining a design schedule includes determining a design schedule based at least in part on the user level value and the complexity value.

2. The method of claim 1, further comprising:
   receiving user input modifying the CAD model information; and
   in response to receiving the user input modifying the CAD model information, updating the determined design schedule.

3. The method of claim 1, further comprising retrieving a user log associated with a user; and
   determining a user level value based on the user log;
   where determining a design schedule includes determining a design schedule based at least in part on the user level value and the complexity value.

4. The method of claim 1, where accessing the CAD model information comprises accessing one or more of an indication of a part family of the CAD model, a part type associated with the CAD model, or one or more operations associated with the CAD model.

5. The method of claim 1, further comprising:
   determining an estimated time to design a part represented by the CAD model;
   determining an actual time to design the part, where an actual time represents an actual time to design a part having a same part type;
   comparing the actual time to design the part with the estimated time to design the part; and
   if the actual time differs from the estimated time by more than a threshold value, then determining a design schedule further comprises determining a design schedule further based on the actual time.

6. The method of claim 1, wherein determining a complexity value includes determining a complexity value based at least upon a number or type of operations associated with a previously designed CAD model.

7. The method of claim 1, wherein a complexity value represents a complexity associated with designing the CAD model.

8. A computer implemented method comprising:
   accessing a computer aided design (CAD) model information;
   determining a complexity value for a CAD model from the CAD model information; and
   determining a design schedule for designing the CAD model on a computer based at least in part on the complexity value and further based on a user level value that indicates a skill level of a user to design the CAD model.

9. The method of claim 8, further comprising:
   receiving user input modifying the CAD model information; and
   in response to receiving the user input modifying the CAD model information, updating the determined design schedule.

10. The method of claim 8, further comprising retrieving a user log associated with a user and determining the user level value based on the user log.

11. The method of claim 8, where accessing the CAD model information comprises accessing one or more of an indication of a part family of the CAD model, a part type associated with the CAD model, or one or more operations associated with the CAD model.

12. The method of claim 8, further comprising:
   determining an estimated time to design a part represented by the CAD model;
   determining an actual time to design the part, where an actual time represents an actual time to design a part having a same part type;
   comparing the actual time to design the part with the estimated time to design the part; and
   if the actual time differs from the estimated time by more than a threshold value, then determining a design schedule further comprises determining a design schedule further based on the actual time.

13. The method of claim 8, wherein determining a complexity value includes determining a complexity value based at least upon a number or type of operations associated with a previously designed CAD model.

14. The method of claim 8, wherein a complexity value represents a complexity associated with designing the CAD model.

15. A storage medium having stored therein a plurality of instructions that are machine executable, wherein when executed, the executing instructions are operable to:
   access a computer aided design (CAD) model information;
   determine a complexity value for a CAD model from the CAD model information;
   determine a design schedule for designing the CAD model on a computer based at least in part on the complexity value;
   receive an indication of a user identifier;
   retrieve a user log associated with the user identifier; and
   determine a user level value based on the user log;
   where instructions operable to determine a design schedule include instructions operable to determine a design schedule based at least in part on the user level value and the complexity value.

16. The storage medium of claim 15, wherein the executing instructions are further operable to:
   receive user input modifying the CAD model information; and
   update the determined design schedule in response to the user input.

17. The storage medium of claim 15, where the executing instructions are further operable to retrieve:
   a user log associated with a user; and
   determine a user level value based on the user log;
   where determining a design schedule includes determining a design schedule based at least in part on the user level value and the complexity value.

18. The storage medium of claim 15, where the executing instructions operable to access the CAD model information include executing instructions operable to access one or more of an indication of a part family associated with the CAD model, a part type associated with the CAD model, or one or more operations associated with the CAD model.

19. The storage medium of claim 15, wherein the executing instructions further operate to:
   determine an estimated time to design a part associated with the CAD model;
   determine an actual time to design the part, where an actual time represents an actual time to design a part having a same part type;
   compare the estimated time to design the part with the actual time to design the part; and
   if the actual time differs from the estimated time by greater than a threshold value, then to determine a design schedule further based on the actual time.

20. The storage medium of claim 15, wherein the executing instructions operable to determine a complexity value include executing instructions operable to determine a complexity value based at least upon a number or type of operations associated with a previously designed CAD model.

21. The storage medium of claim 15, wherein a complexity value represents a complexity associated with designing a CAD model.

22. A storage medium having stored therein a plurality of instructions that are machine executable, wherein when executed, the executing instructions are operable to:
   access a computer aided design (CAD) model information;
   determine a complexity value for a CAD model from the CAD model information; and
   determine a design schedule for designing the CAD model on a computer based at least in part on the complexity value and further based on a user level value that indicates a skill level of a user to design the CAD model.

23. The storage medium of claim 22, wherein the executing instructions are further operable to:
   receive user input modifying the CAD model information; and
   update the determined design schedule in response to the user input.

24. The storage medium of claim 22, where the executing instructions are further operable to retrieve a user log associated with a user and determine the user level value based on the user log.

25. The storage medium of claim 22, where the executing instructions operable to access the CAD model information include executing instructions operable to access one or more of an indication of a part family associated with the CAD model, a part type associated with the CAD model, or one or more operations associated with the CAD model.

26. The storage medium of claim 22, wherein the executing instructions further operate to:
   determine an estimated time to design a part associated with the CAD model;
   determine an actual time to design the part, where an actual time represents an actual time to design a part having a same part type;
   compare the estimated time to design the part with the actual time to design the part; and
   if the actual time differs from the estimated time by greater than a threshold value, then to determine a design schedule further based on the actual time.

27. The storage medium of claim 22, wherein the executing instructions operable to determine a complexity value include executing instructions operable to determine a complexity value based at least upon a number or type of operations associated with a previously designed CAD model.

28. The storage medium of claim 22, wherein a complexity value represents a complexity associated with designing a CAD model.

29. An apparatus comprising:
   a storage medium having stored therein a plurality of instructions that are machine executable, wherein when executed, the executing instructions are operable to:
   access a computer aided design (CAD) model information;
   determine a complexity value for a CAD model corresponding to the CAD model information;
   determine a design schedule for designing the CAD model on a computer based at least in part on the complexity value associated with the CAD model;
   receive an indication of a user identifier;
   retrieve a user log associated with the user identifier; and
   determine a user level value based on the user log; and
   a processor coupled to the storage medium to execute the instructions.

30. The apparatus of claim 29, wherein the executing instructions are further operable to:
   receive user input modifying the CAD model information; and
   update the determined design schedule in response to the user input.

31. The apparatus of claim 29, wherein the executing instructions are further operable to:
   retrieve a user log associated with a user; and
   determine a user level value based on the user log;
   wherein determining a design schedule includes determining a design schedule based at least in part on the user level value and the complexity value.

32. The apparatus of claim 29, wherein the executing instructions operable to access the CAD model information include executing instructions operable to access one or more of an indication of a part family associated with the CAD model, a part type associated with the CAD model, or one or more operations associated with the CAD model.

33. The apparatus of claim 29, wherein the executing instructions are further operable to:
   determine an estimated time to design a part associated with the CAD model;
   determine an actual time to design the part, where an actual time represents an actual time to design a part having a same part type;
   compare the estimated time to design the part with the actual time to design the part; and
   if the actual time differs from the estimated time by greater than a threshold value, then determine a design schedule further based on the actual time.

34. The apparatus of claim 29, wherein the executing instructions operable to determine a complexity value include executing instructions operable to determine a complexity value based at least upon a number or type of operations associated with a previously designed CAD model.

35. The apparatus of claim 29, wherein a complexity value represents a complexity associated with designing a CAD model.

36. An apparatus comprising:
   a storage medium having stored therein a plurality of instructions that are machine executable, wherein when executed, the executing instructions are operable to:
      access a computer aided design (CAD) model information;
      determine a complexity value for a CAD model corresponding to the CAD model information; and
      determine a design schedule for designing the CAD model on a computer based at least in part on the complexity value associated with the CAD model and further based on a user level value that indicates a skill level of a user to design the CAD model; and
   a processor coupled to the storage medium to execute the instructions.

37. The apparatus of claim 36, wherein the executing instructions are further operable to:
   receive user input modifying the CAD model information; and
   update the determined design schedule in response to the user input.

38. The apparatus of claim 36, wherein the executing instructions are further operable to retrieve a user log associated with a user and determine a user level value based on the user log.

39. The apparatus of claim 36, wherein the executing instructions operable to access the CAD model information include executing instructions operable to access one or more of an indication of a part family associated with the CAD model, a part type associated with the CAD model, or one or more operations associated with the CAD model.

40. The apparatus of claim 36, wherein the executing instructions are further operable to:
   determine an estimated time to design a part associated with the CAD model;
   determine an actual time to design the part, where an actual time represents an actual time to design a part having a same part type;
   compare the estimated time to design the part with the actual time to design the part; and
   if the actual time differs from the estimated time by greater than a threshold value, then determine a design schedule further based on the actual time.

41. The apparatus of claim 36, wherein the executing instructions operable to determine a complexity value include executing instructions operable to determine a complexity value based at least upon a number or type of operations associated with a previously designed CAD model.

42. The apparatus of claim 36, wherein a complexity value represents a complexity associated with designing a CAD model.

* * * * *